(12) United States Patent
Khakifirooz et al.

(10) Patent No.: US 10,242,734 B1
(45) Date of Patent: Mar. 26, 2019

(54) RESUMING STORAGE DIE PROGRAMMING AFTER POWER LOSS

(71) Applicant: INTEL CORPORATION, Santa Clara, CA (US)

(72) Inventors: Ali Khakifirooz, Los Altos, CA (US); Rohit S. Shenoy, Fremont, CA (US); Pranav Kalavade, San Jose, CA (US); Aliasgar S. Madraswala, Folsom, CA (US); Yogesh B. Wakchaure, Folsom, CA (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/720,492

(22) Filed: Sep. 29, 2017

(51) Int. Cl.
*G11C 16/04* (2006.01)
*G11C 11/56* (2006.01)
*G11C 16/34* (2006.01)
*G11C 7/10* (2006.01)

(52) U.S. Cl.
CPC ...... *G11C 11/5628* (2013.01); *G11C 16/0483* (2013.01); *G11C 16/3418* (2013.01); *G11C 16/3427* (2013.01); *G11C 7/1048* (2013.01)

(58) Field of Classification Search
CPC ..... G11C 16/10; G11C 29/52; G11C 11/5635; G11C 11/5628; G11C 2211/5641; G11C 11/5642; G11C 16/16; G11C 16/26; G11C 16/349; G11C 11/5621; G11C 16/0483; G11C 16/3495
See application file for complete search history.

(56) References Cited

U.S. PATENT DOCUMENTS 8,111,549 B2   2/2012   Yip
9,105,333 B1*  8/2015   Hu ................ G11C 13/0069

* cited by examiner

*Primary Examiner* — Thong Q Le
(74) *Attorney, Agent, or Firm* — Konrad Raynes Davda & Victor LLP; Janaki K. Davda

(57) ABSTRACT

Provided are techniques for resuming storage die programming after power loss. In response to receipt of an indication of the power loss, data that was to be programmed to multi-level cell NAND blocks are copied to single level cell NAND blocks and a pulse number at which programming was interrupted is stored. In response to receipt of an indication to resume from the power loss, the data is copied from the single level cell NAND blocks to a page buffer, the pulse number is retrieved, and programming of the multi-level cell NAND blocks is resumed at the retrieved pulse number using the data in the page buffer.

22 Claims, 11 Drawing Sheets

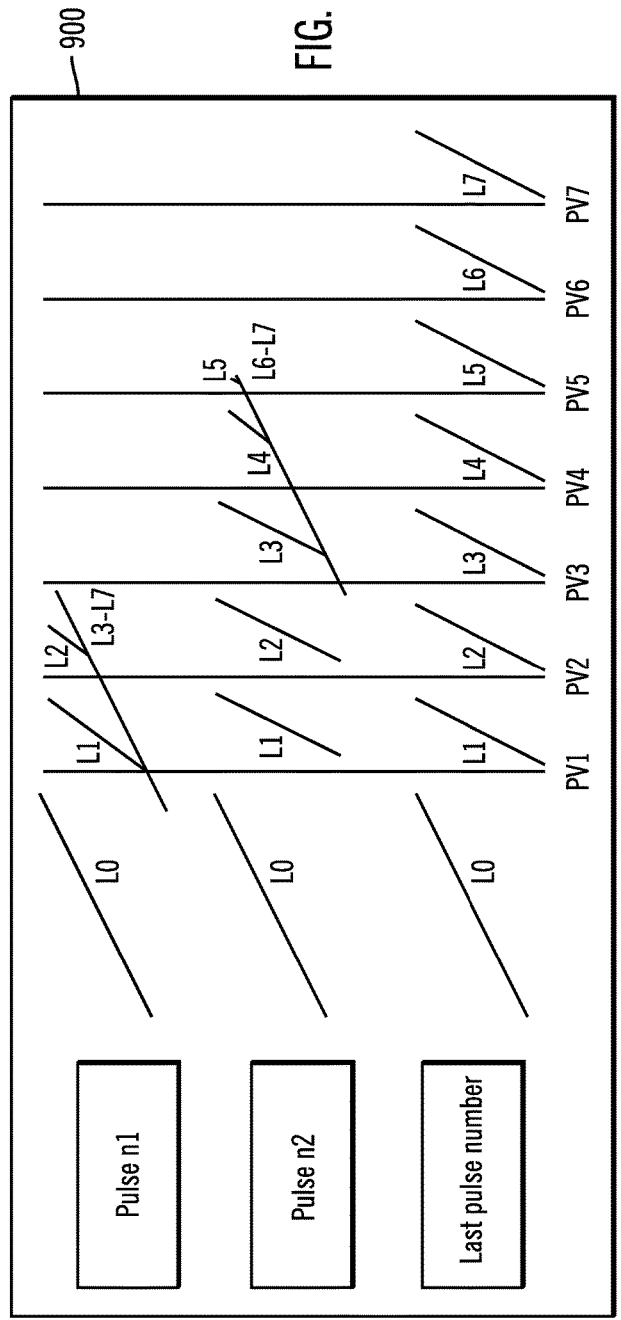

RESUMING STORAGE DIE PROGRAMMING AFTER POWER LOSS

TECHNICAL FIELD

Embodiments described herein generally relate to an apparatus, method, and system for resuming STORAGE DIE storage die programming after power loss.

BACKGROUND

A solid state drive (SSD) may be comprised of one or more packages of non-volatile memory dies, where each die is comprised of memory cells, where memory cells are organized into pages and pages are organized into blocks. Each memory cell can store one or more bits of information. For example, a solid state drive (SSD) may comprise NAND memory cells, which may be referred to as NAND flash memory.

The NAND includes wordlines that are programmed in pulses (loops). While NAND wordlines are being programmed, it is possible that there is a power loss. This may leave a wordline partially programmed (i.e. not all pulses for that wordline have been programmed). Upon resuming programming of a partially programmed wordline, when recovering from a power loss, conventional systems do not know at which pulse the programming was interrupted (or suspended). Therefore, conventional systems start reprogramming from pulse #1 (i.e. the lowest applied program voltage). While the memory cells that are already programmed before power loss are inhibited (i.e. appropriate voltage is applied to their corresponding bitlines), some program pulses are unnecessarily applied. This has two adverse effects: 1) NAND memory cells are exposed to additional program disturb unnecessarily; and 2) programming time after recovery from power loss is longer.

BRIEF DESCRIPTION OF THE DRAWINGS

Embodiments are described by way of example, with reference to the accompanying drawings, which are not drawn to scale, in which like reference numerals refer to similar elements.

FIG. 9A illustrates how programming distribution progresses after a certain number of program pulses for a TLC NAND in accordance with certain embodiments.

FIG. 9B illustrates a lookup table in accordance with certain embodiments.

DESCRIPTION OF EMBODIMENTS

There is a need in the art for improved techniques for determining a start programming voltage after recovery from a power loss event.

Embodiments avoid having many program attempts in a nested power loss scenario that is avoided because of knowledge of which pulse number the previous programming was interrupted at. Embodiments also avoid exposing storage die (e.g. NAND) memory cells to unnecessary programming and shorten the time for programming by avoiding reprogramming of some pulses of a wordline.

In the following description, numerous specific details such as logic implementations, opcodes, means to specify operands, resource partitioning/sharing/duplication implementations, types and interrelationships of system components, and logic partitioning/integration choices are set forth in order to provide a more thorough understanding of the present invention. It will be appreciated, however, by one skilled in the art that the invention may be practiced without such specific details. In other instances, control structures, gate level circuits and full software instruction sequences have not been shown in detail in order not to obscure the invention. Those of ordinary skill in the art, with the included descriptions, will be able to implement appropriate functionality without undue experimentation.

References in the specification to "one embodiment," "an embodiment," "an example embodiment," etc. indicate that the embodiment described may include a particular feature, structure, or characteristic, but every embodiment may not necessarily include the particular feature, structure, or characteristic. Moreover, such phrases are not necessarily referring to the same embodiment. Certain embodiments relate to storage device electronic assemblies. Embodiments include both devices and methods for forming electronic assemblies.

Figure 1:
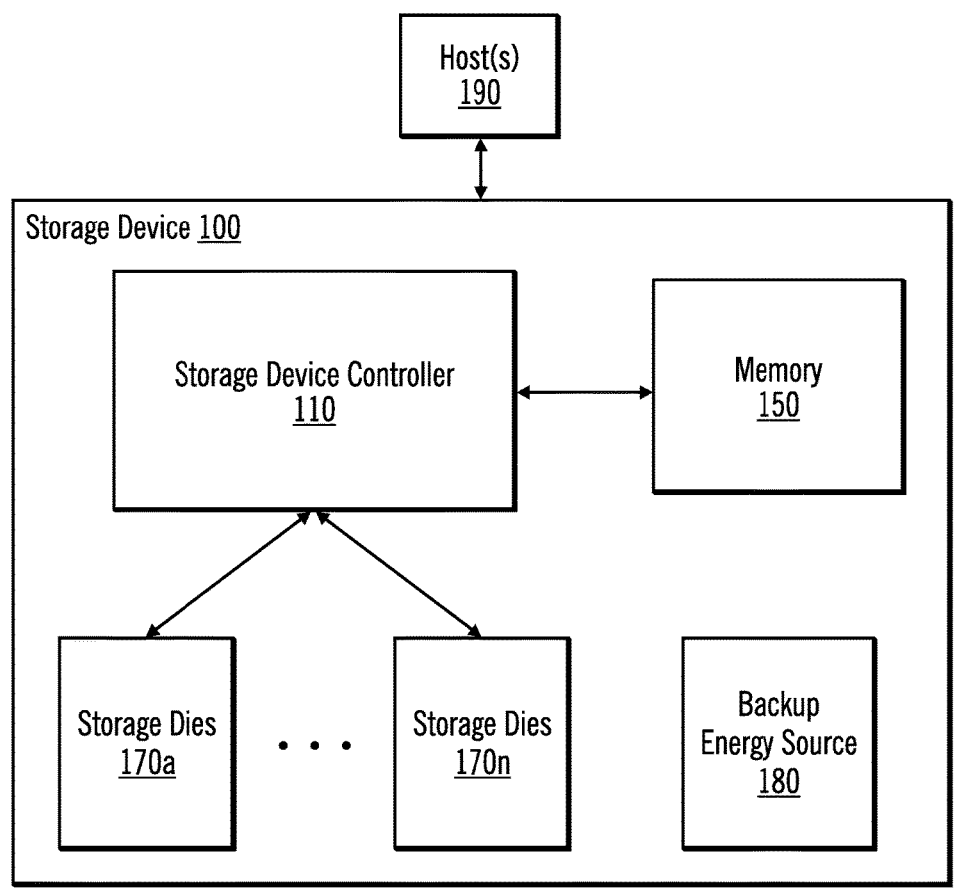
FIG. 1 illustrates a computing environment in accordance with certain embodiments.

FIG. 1 illustrates a computing environment in accordance with certain embodiments. In FIG. 1, a storage device 100 includes a storage device controller 110. The storage device 100 also includes memory 150 and storage dies 170a ... 170n coupled to the storage device controller 110. Moreover, the storage device 100 includes a backup energy source 180. One or more hosts 190 may issue lookup or update requests to the storage device 100.

In certain embodiments, the storage device 100 is an SSD, the memory is a byte addressable write-in-place memory which may be volatile (for example, DRAM) or non-volatile (for example, three dimensional cross point memory), and the storage dies 170a ... 170n are block addressable non-volatile memory (for example, NAND).

With embodiments, the storage dies 170a ... 170n are NANDs. The memory 150 or storage dies 170a ... 170n may also include future generation nonvolatile devices, such as a three dimensional crosspoint memory device, or other byte-addressable write-in-place nonvolatile memory devices. In one embodiment, the memory may be or may include memory devices that use chalcogenide glass, single or multi-level phase change memory (PCM), a resistive memory, nanowire memory, ferroelectric transistor random access memory (FeTRAIVI), magnetoresistive random access memory (MRAIVI) memory that incorporates memristor technology, or spin transfer torque (STT)-MRAM, a spintronic magnetic junction memory based device, or a combination of any of the above, or other memory. A memory device may refer to the die itself and/or to a packaged memory product. Volatile memory may be a storage medium that requires power to maintain the state of data stored by the medium. Non-limiting examples of volatile memory may include various types of random access memory (RAM), such as dynamic random access memory (DRAM) or static random access memory (SRAM). One particular type of DRAM that may be used in a memory module is synchronous dynamic random access memory (SDRAM). In particular embodiments, DRAM of a memory component may comply with a standard promulgated by JEDEC, such as JESD79F for DDR SDRAM, JESD79-2F for DDR2 SDRAM, JESD79-3F for DDR3 SDRAM, JESD79-4A for DDR4 SDRAM, JESD209 for low power DDR (LPDDR), JESD209-2 for LPDDR2, JESD209-3 for LPDDR3, and JESD209-4 for LPDDR4 (these standards are available at www jedec.org). Such standards (and similar standards) may be referred to as DDR-based standards and communication interfaces of the storage devices that implement such standards may be referred to as DDR-based interfaces.

With embodiments, the storage dies 170a . . . 170n are a non-volatile memory of storage cells that may be organized into pages of storage cells, where the pages are organized into blocks. The non-volatile memory storage device 100 may function as both a memory device and/or a storage device in a computing system, and may be used to perform the role of volatile memory devices and a storage device (for example, a SSD) in a computing system.

Figure 2:
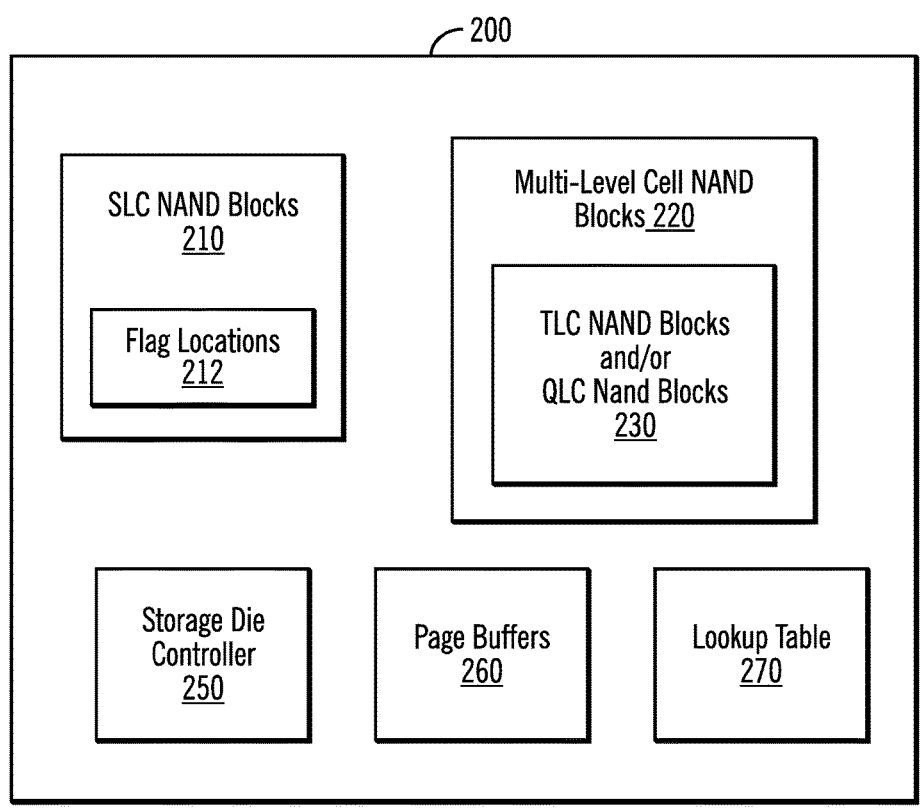
FIG. 2 illustrates further details of a storage die in accordance with certain embodiments.

FIG. 2 illustrates further details of a storage die 200 in accordance with certain embodiments. With embodiments, each of the storage dies 170a . . . 170n may take on the architecture of storage die 200. The storage die 200 may include a plurality of SLC NAND blocks 210 and a plurality of multi-level cell NAND blocks 220, such as triple level cell (TLC) NAND blocks or quad level cell (QLC) NAND blocks 230. The SLC NAND blocks 210 include flag locations 212. In various embodiments, the storage die 200 may include a storage die controller 250, and a page buffer 260. For certain embodiments, the storage die 200 includes a lookup table 270. The storage die 200 may be block addressable non-volatile memory.

In a single-level cell (SLC) NAND, each memory cell may exist in one of two states ("0" or "1"), and store one bit of information per memory cell. A multi-level cell (MLC) NAND is a solid-state flash memory that uses multiple levels per memory cell to allow more bits to be stored using the same number of transistors. Some MLC NANDs have four possible states per memory cell, so they may store two bits of information per memory cell. TLC NAND is a type of multi-level solid-state NAND that stores three bits of information per memory cell of flash media. QLC NAND is a type of multi-level solid-state NAND that stores four bits of information per memory cell of flash media.

Each memory cell of the NAND flash device uses one transistor. Each memory cell includes a floating gate that may be programmed to hold a charge or erased to remove the charge.

Figure 3:
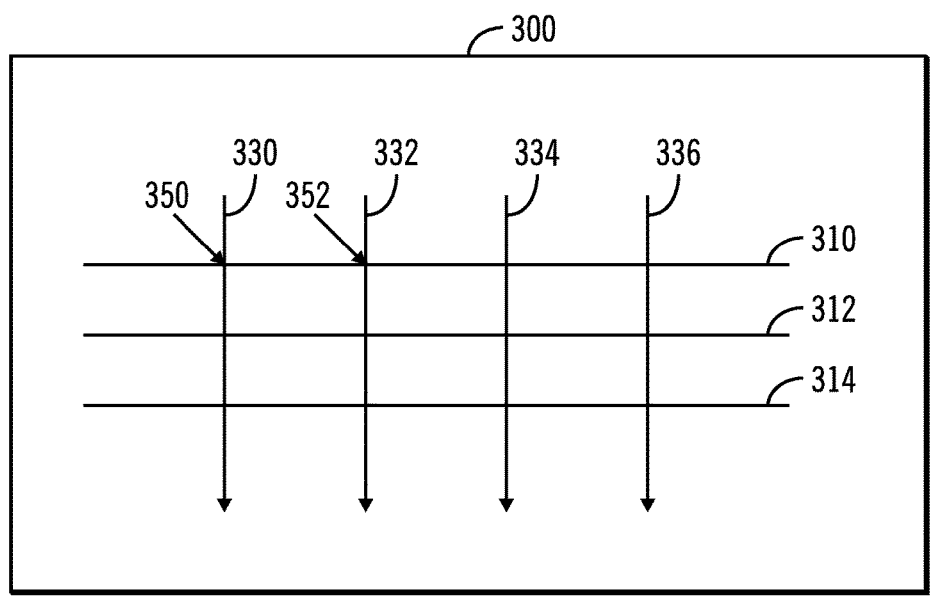
FIG. 3 illustrates a NAND memory array that includes wordlines in accordance with certain embodiments.

FIG. 3 illustrates a NAND memory array 300 that includes wordlines in accordance with certain embodiments. In FIG. 3, the NAND memory array includes wordlines 310, 312, 314, which intersect bit lines 330, 332, 334, 336. Thus, the wordlines 310, 312, 314 are arranged in rows, while the bit lines 330, 332, 334, 336 are arranged in columns. A memory cell, such as memory cell 350, is at the intersection of a row and a column of the NAND array 300.

The wordlines 310, 312, 314 are connected to control gates of transistors of the memory cells. A plurality of wordlines (e.g. wordlines 310 and 312) may constitute a block that may be erased together. Each block may include a fixed number, such as 16, 32, 64, or 128, of sequential pages.

During an operation to program a memory cell 350, a wordline 310 is selected that is connected to the memory cell 350, and the wordline 310 is supplied with a series of program voltage pulses. Voltage pumps on the NAND flash die provide the high voltages required. In certain embodiments, the program voltages may start from about 15 volts (V) and increase incrementally to end at about 25 V.

An unselected memory cell, such as memory cell 352, on the selected wordline 310 can also have the programming pulse applied to its wordline. In order to prevent the unselected memory cell 352 on the selected wordline 310 from being programmed, its bit line 332 is biased to an inhibiting potential (e.g. that may be about 3-6 V).

A memory cell is incrementally programmed by applying a start program voltage pulse to selected wordlines in a memory block, followed by a series of program voltage pulses, until an end program voltage pulse achieves a target threshold voltage.

Figure 4:
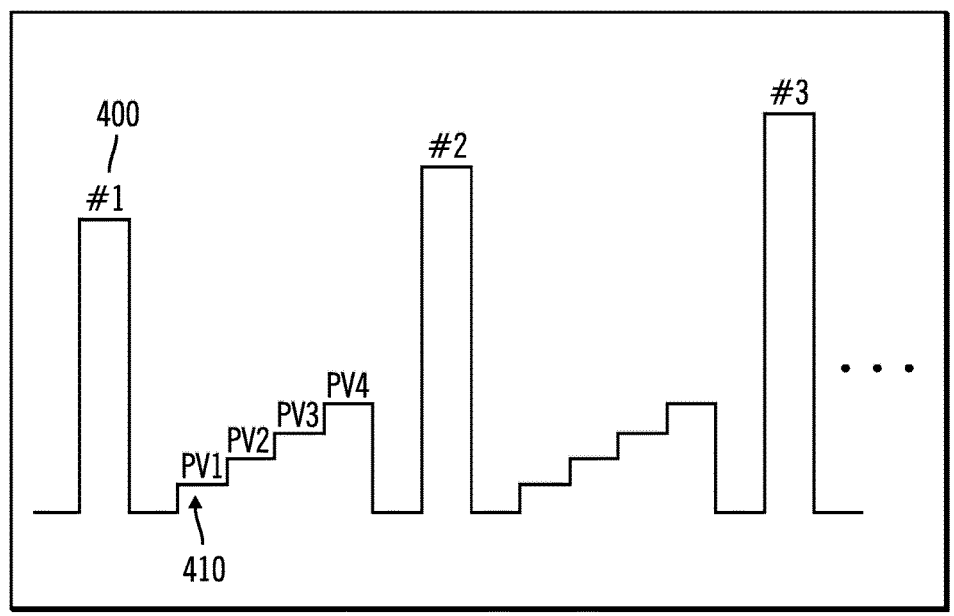
FIG. 4 illustrates an example for programming a wordline in a NAND in accordance with certain embodiments.

FIG. 4 illustrates an example for programming a wordline in a NAND in accordance with certain embodiments. To program a wordline in a NAND component, typically a series of programming voltages with increasing amplitude are applied to the wordline. Each programming pulse is followed by a set of verify levels where the threshold voltage of the NAND memory cells are compared to a verify voltage. To program a multi-level cell NAND component, for example TLC or QLC NAND, many such programming pulses and verify levels are needed. For example, in FIG. 4, after pulse #1 400, there are verify levels at voltage levels PV1, PV2, PV3, PV4 410.

In FIG. 4, there is a programming sequence to program a memory cell in a multi-level cell NAND device. A series of programming pulses with increasing amplitude denoted by #1, #2, #3 . . . are applied to the selected wordline, each followed by a set of verify levels to compare the threshold voltage of the memory cells against verify levels (e.g. PV1, PV2, PV3, PV4 410 for pulse #1) etc.

If a power loss event occurs while the storage die 200 is in the middle of programming a particular wordline, the data stored on that wordline becomes corrupt. In some power loss immunity (PLI) policies, a backup energy source 180, typically a capacitor, is provided to either finish the programming or copy the data to a backup location on the storage die 200. When an indication of power loss is received by the storage die 200, the storage die 200 first determines if it is able to finish programming of the wordline within the time limit set by the energy stored in the PLI capacitor and the power consumption of the storage device 100. If yes, the storage die 200 finishes the programming. If not, the storage die 200 stores the content of the pages that were being used to program the wordline in a backup location in the storage die 200 and with a programming mode that is faster. For example, programming memory cells in a QLC mode may take up to 10 milliseconds (ms), while programming 4 pages of data associated with a given QLC wordline into SLC locations may take about 1 ms.

Upon recovering from a power loss event, the storage device 100 needs to read the data from the backup locations (e.g. SLC blocks) and resume programming of the target wordline. The storage device 100 does not have a prior knowledge at which program pulse programming was interrupted. In conventional systems, with the absence of this information, storage die 200 will resume programming from a first programming pulse. A series of programming voltages with increasing magnitude are applied similar to normal programming, each followed by a set of verify levels. Until the programming voltage reaches the value where the program was interrupted due to power loss, no programming takes place. In other words, the time and energy spent on program and verify levels before reaching the step at which programming was interrupted are wasted. This is not desirable, especially if another power loss event happens when resuming programming after a previous power loss (nested power loss). Another undesirable effect of resuming from the first program pulse is that it exposes the memory cells to unnecessarily program disturb effects. Therefore, embodiments employ a mechanism to determine at which pulse number programming was interrupted and resume the programming from that pulse number. Pulse number may also be referred to as pulse count or loop count.

In certain embodiments, upon receiving a power loss event and when storing the data in the backup location (e.g. in SLC blocks), the storage die 200 also stores the pulse number at which programming was interrupted in certain locations. In certain embodiments, the pulse number may be stored in flag locations (e.g. in bits or bytes) of the SLC pages used for backup of the data. In other embodiments, the pulse number may be stored in separate registers. Upon resuming the programming after power loss, storage die 200 first reads the SLC locations to recover the data needed to resume the programming. It also extracts the pulse number at which programing was interrupted (i.e. extracts the pulse number from flag locations (e.g. bytes) of the SLC pages). Then, instead of resuming the program from first pulse, the storage die 200 uses the pulse number to resume from this pulse number at which programming was interrupted. In some embodiments, storage die 200 may resume programming from a pulse number smaller than the one at which the power loss event occurred to account for possible charge loss.

Figure 5:
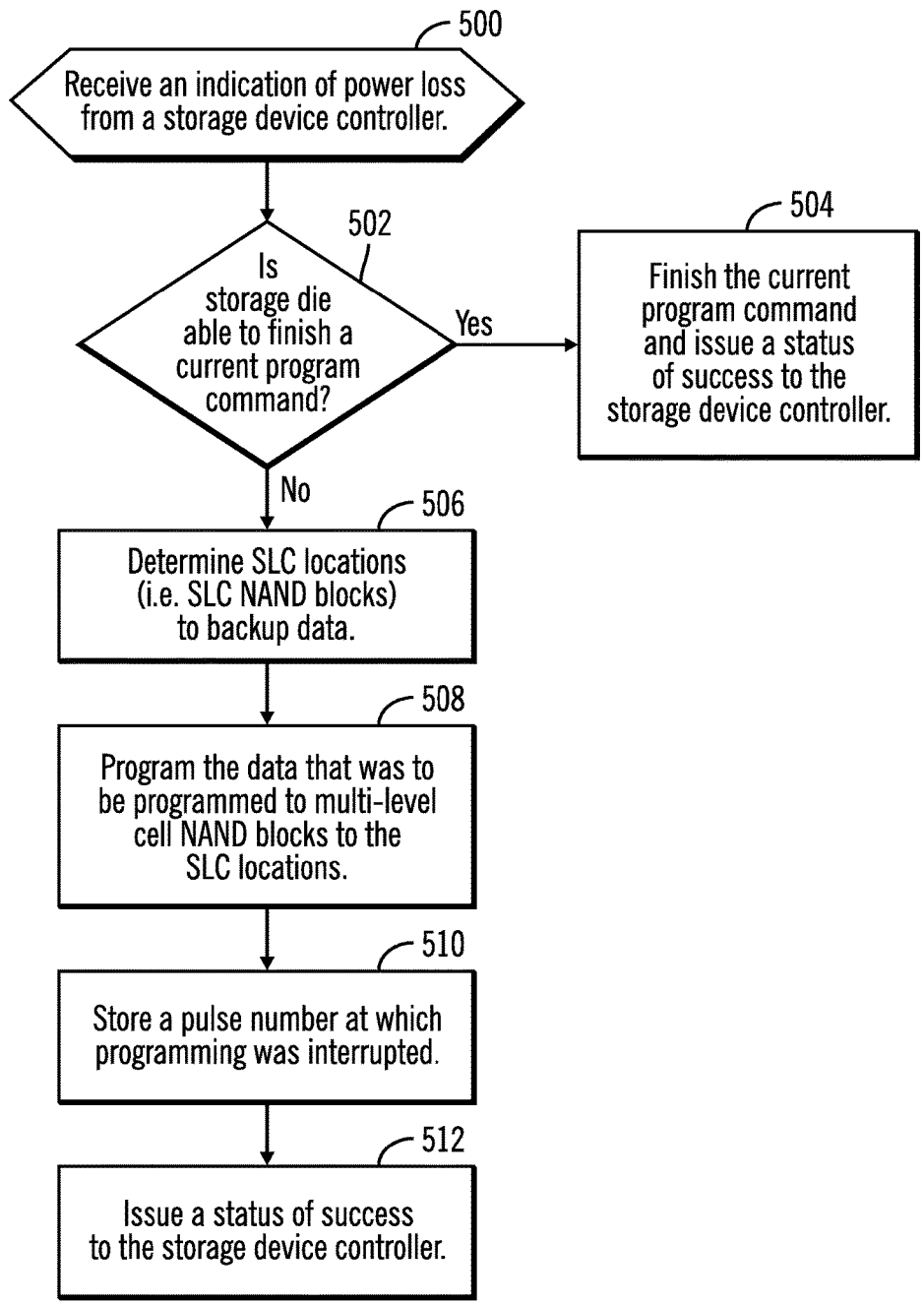
FIG. 5 illustrates, in a flow diagram, operations for processing an indication of a power loss in accordance with certain embodiments.

FIG. 5 illustrates, in a flow diagram, operations for processing an indication of power loss in accordance with certain embodiments. Control begins at block 500 with the storage die 200 receiving an indication of a power loss from the storage device controller 110. With embodiments, the indication of power loss may be one or more commands to indicate power loss. In other embodiments, the indication of power loss may be a signal, such as a sideband signal.

In block 502, the storage die 200 determines whether it is able to finish a current program command. If so, processing continues to block 504, otherwise, processing continues to block 506.

In block 504, the storage die 200 finishes the current program command and issues a status of success to the storage device controller 110.

In block 506, the storage die 200 determines SLC locations (i.e. SLC NAND blocks 210) to backup data. With embodiments, specific SLC locations to back up the data in a power loss event are typically assigned by the storage device controller 110 when the storage device 100 is powered up. In block 508, the storage die controller 250 programs (i.e. copies) the data that was to be programmed to multi-level cell NAND blocks 220, such as TLC NAND blocks or QLC NAND blocks 230, to the corresponding SLC locations, which are SLC NAND blocks 210. This data is already loaded in the page buffers 260. For example, there may be 3 pages of data to program a TLC, with a power loss interruption of the programming, then the 3 pages of data are backed up to 3 SLC locations because it is faster to backup data to SLC locations than to multi-level cell locations (i.e. TLC or QLC locations).

In block 510, the storage die controller 250 stores a pulse number at which programming was interrupted. In certain embodiments, the storage die controller writes a pulse number to SLC flag locations of the SLC pages used for backing up the data. In block 512, the storage die controller 250 issues a status of success to the storage device controller 110

Figure 6:
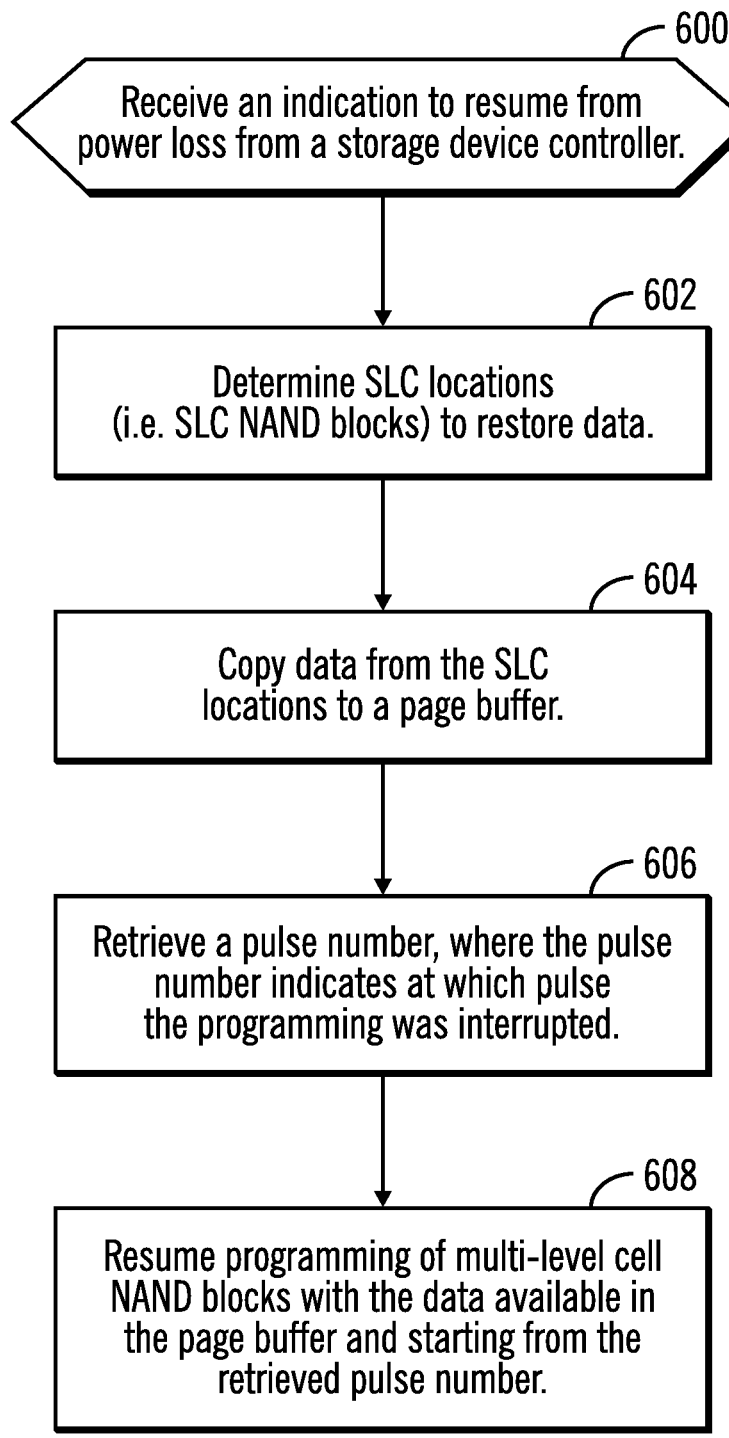
FIG. 6 illustrates, in a flow diagram, operations for resuming programming of a wordline after power loss in accordance with certain embodiments.

FIG. 6 illustrates, in a flow diagram, operations for resuming programming of a wordline after power loss in accordance with certain embodiments. Control begins at block 600 with the storage die 200 receiving an indication to resume from (after) power loss from the storage device controller 110. With embodiments, the indication to resume from power loss may be one or more commands to resume programming of the wordline after power loss. In other embodiments, the indication to resume from power loss may be a signal.

In block 602, the storage die controller 250 determines SLC locations (i.e. SLC NAND blocks 210) from which to restore data. These are the SLC locations used to store data in blocks 506-508 of FIG. 5.

In block 604, the storage die controller 250 copies data from the SLC locations to a page buffer 260. In block 606, the storage die controller 250 retrieves (extracts) a pulse number, where the pulse number indicates at which pulse the programming was interrupted. In certain embodiments, the storage die controller 250 extracts the pulse number from SLC flag locations of the SLC pages used for backing up the data. In block 608, the storage die controller 250 resumes programming of the multi-level cell NAND blocks 220 (i.e. wordline) with the data available in the page buffer 260 and starting from the retrieved pulse number.

In alternative embodiments, the pulse number at which the programming was interrupted is not stored when programming is interrupted due to power loss; rather this information is retrieved from the data already available on the wordline whose programming was interrupted.

In such alternative embodiments, to resume programming of a wordline in a multi-level cell NAND, such as a TLC NAND or a QLC NAND, during recovery from power loss, the storage die controller 250 compares the threshold voltage of the memory cells for that wordline against the expected levels based on the data that is supposed to be written to them. The highest level that is correctly programmed before power loss is determined and is used to set the starting program voltage.

Figure 7:
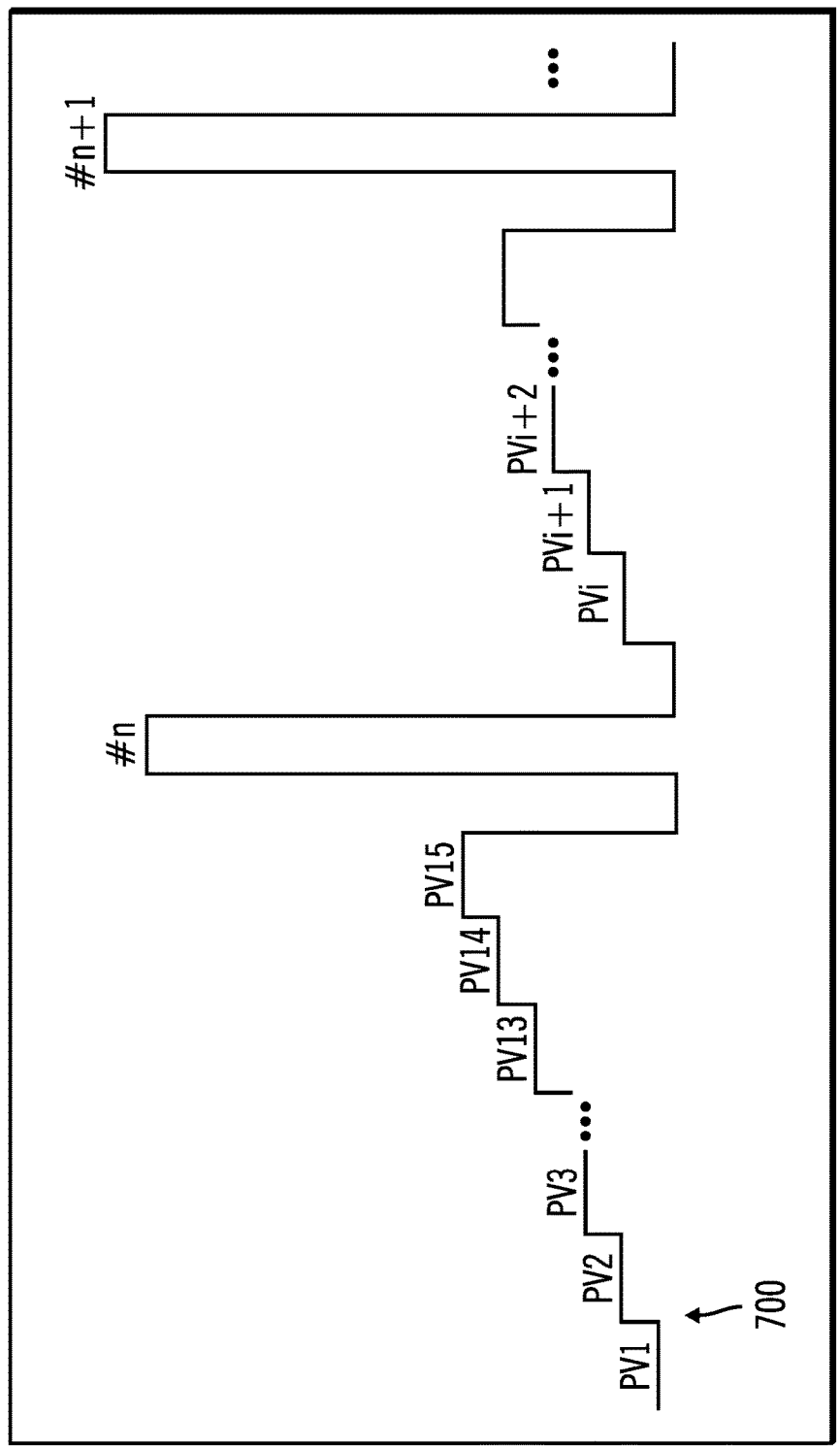
FIG. 7 illustrates, an example for programming a wordline in a NAND in accordance with certain alternative embodiments.

FIG. 7 illustrates, an example for programming a wordline in a NAND in accordance with certain alternative embodiments. In FIG. 7, a number of verify levels are performed before applying any program pulse to the wordline. For example, in a QLC NAND a number of verify levels at levels PV1, PV2, PV15 700 are performed. Similarly, in a TLC NAND a number of verify levels at levels PV1, PV2, PV7 are performed. Based on this verify level, the storage die controller 250 determines the highest level with all corresponding memory cells passing verify. The storage die controller 250 then uses a lookup table 270 to determine the pulse number at which it will resume the programming.

Figure 8A:
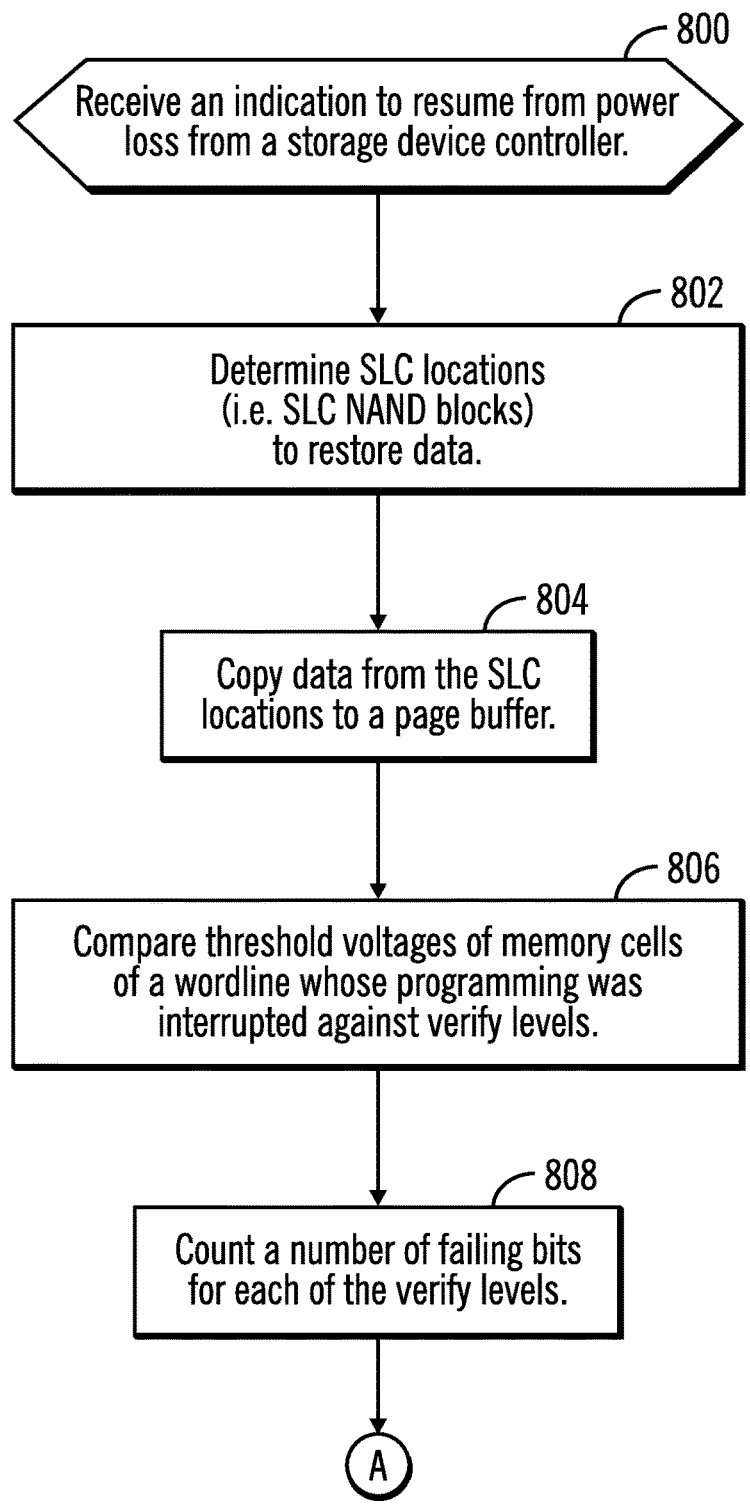
FIGS. 8A and 8B illustrate, in a flow diagram, operations for resuming programming of a wordline after power loss in accordance with certain alternative embodiments.
Figure 8B:
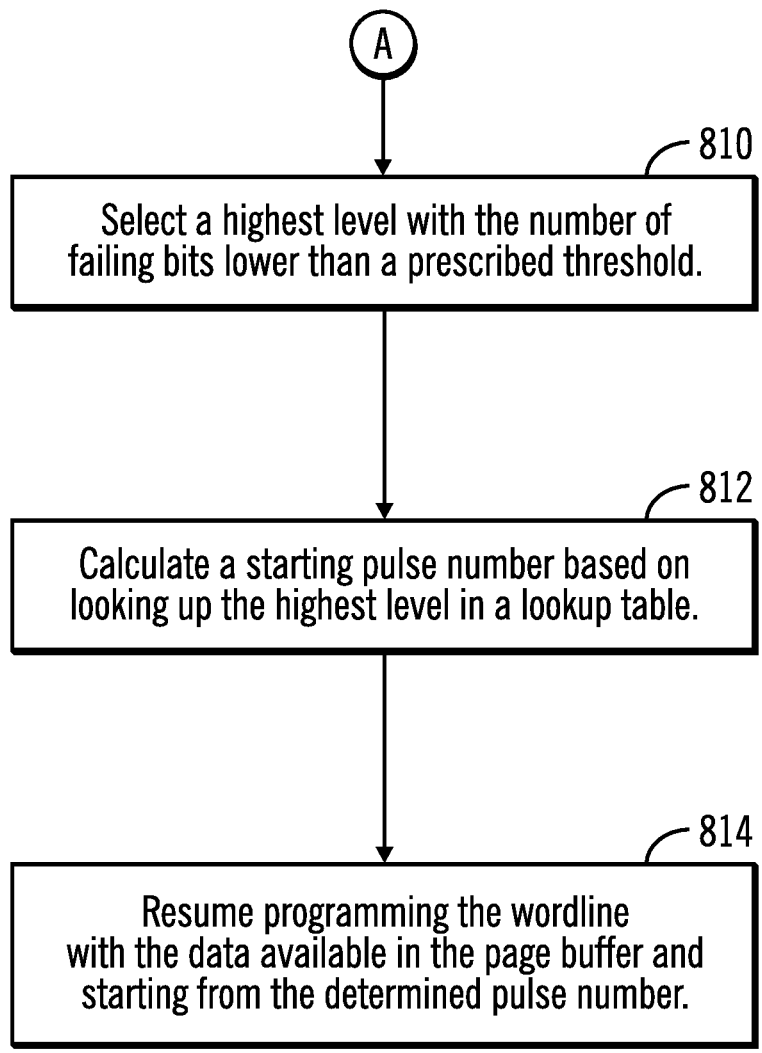

FIGS. 8A and 8B illustrate, in a flow diagram, operations for resuming programming of a wordline after power loss in accordance with certain alternative embodiments. Control begins at block 800 with the storage die 200 receiving an indication to resume from (after) power loss from the storage device controller 110. With embodiments, the indication to resume from power loss may be one or more commands to resume programming of the wordline after power loss. In other embodiments, the indication to resume from power loss may be a signal.

In block 802, the storage die controller 250 determines SLC locations (i.e. SLC NAND blocks 210) from which to restore data. These are the SLC locations used to backup data when programming was interrupted.

In block 804, the storage die controller 250 copies data from the SLC locations to a page buffer 260. In block 806, the storage die controller 250 compares threshold voltages of memory cells of the wordline whose programming was interrupted against verify levels. In block 808, storage die controller 250 counts the number of failing bits for each of the verify levels. Processing continues from block 808 (FIG. 8A) to block 810 (FIG. 8B). In block 810, the storage die controller 250 selects a highest level with the number of failing bits lower than a prescribed threshold. In block 812, the storage die controller 250 calculates a starting pulse number based on looking up the highest level in a lookup table 270. In block 814, the storage die controller 250 resumes programming the wordline with the data available in the page buffer 260 and starting from the determined pulse number.

FIG. 9A illustrates how programming distribution progresses 900 after a certain number of program pulses for a TLC NAND in accordance with certain embodiments. Distributions are drawn in the form of cumulative distribution function (CDF). To program 3 bits of information for each cell, cells are programmed from an erase state L0 into one of the 8 states L0, L1, . . . , L7 depending the corresponding data for each cell. A series of programming pulses with increasing amplitude are applied to the wordline that is being programmed. So, the threshold voltage of the cells gradually increases as the program pulses are applied. After each program pulse is applied, the threshold voltage of cells are compared against a set of verify levels. Cells that pass the verify levels are inhibited for the rest of program operations. In the example of FIG. 9A, at pulse number n2, all memory cells that belong to L1 and L2 are programmed (passing their corresponding PV levels), while levels L3 and above are still being programmed. With embodiments, when resuming programming from a power loss event a series of verify levels are performed for all verify levels PV1, PV2, PV7 before applying any program pulse and the highest verify level with all memory cells passing the verification is selected. In an example where the program was interrupted at pulse n2, performing this verify level identifies L2 as the highest level with all cells passing the corresponding verify level PV2. Hence programming can be resumed based on a lookup table 270 that correlates the highest level that passes verify to a corresponding start program pulse FIG. 9B illustrates a lookup table 950 in accordance with certain embodiments. The lookup table 950 has columns for a level, an expected start pulse, and an expected end pulse. Continuing with the example of FIG. 9A, L2 has been identified as being the highest level with all memory cells passing the verify levels. Going to the lookup table 950, for level 2, the expected start pulse is 2 and the expected end pulse is 9. Thus, the storage die controller 250 determines that the corresponding pulse number at which programming was y interrupted is likely pulse #9. Accordingly, programming is resumed from pulse #9. In certain embodiments, programming is resumed from a pulse number smaller than the one at which the power loss event occurred (e.g. pulse #8) to account for possible charge loss.

In certain embodiments, the lookup table 270 is constructed empirically by measuring the threshold voltage of cells at each program pulse. For example, the table may be constructed empirically based on typical progression of voltage distribution as program pulses are applied, and, because, there may be variations (e.g. die to die, block to block, and page to page on program speed), the lookup table may be a factory setting based on electrical measurements on a population of storage dies.

Embodiments minimize the number of unnecessary program pulses. Program disturb is reduced compared to conventional systems. Moreover, by avoiding unnecessary program pulses, the probability of nested power loss events is reduced.

Figure 10:
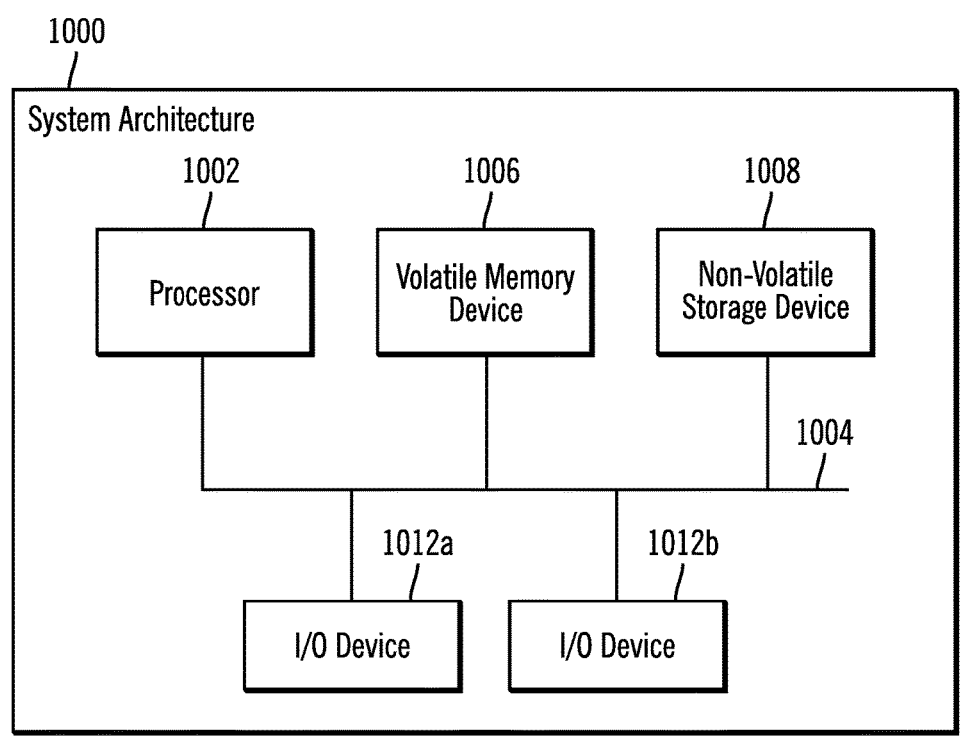
FIG. 10 illustrates an embodiment of a computer architecture in accordance with certain embodiments.

FIG. 10 illustrates an embodiment of a system architecture 1000 in accordance with certain embodiments. Storage device 100 and/or host 190 may implement system architecture 1000. The computer architecture 1000 includes a processor 1002 that communicates over a bus 1004 with a volatile memory device 1006 in which programs, operands and parameters being executed are cached, and a non-volatile storage device 1008. The bus 1004 may comprise multiple buses. Further, the bus 1004 may comprise a multi-agent bus or not be a multi-agent bus, and instead provide point-to-point connections according to PCIe architecture. The processor 1002 may also communicate with Input/output (I/O) devices 1012*a*, 1012*b*, which may comprise input devices, display devices, graphics cards, ports, network interfaces, etc.

In certain embodiments, the computer architecture 1000 may comprise a personal computer, server, mobile device or embedded compute device. In a silicon-on-chip (SOC) implementation, the computer architecture 1000 may be implemented in an integrated circuit die.

The described embodiments may be implemented as a method, apparatus, device, and computer program product comprising a computer readable storage medium using standard programming and/or engineering techniques to produce software, firmware, hardware, or any combination thereof. The described operations may be implemented as code or logic maintained in a "computer readable storage medium". The term "code" as used herein refers to software program code, hardware logic, firmware, microcode, etc. The computer readable storage medium, as that term is used herein, includes a tangible element, including at least one of electronic circuitry, integrated circuit dies, storage materials, a casing, a housing, a coating, and hardware. A computer readable storage medium may comprise, but is not limited to, a magnetic storage medium (e.g. hard disk drives, floppy disks, tape, etc.), optical storage (CD-ROMs, DVDs, optical disks, etc.), volatile and non-volatile memory devices (e.g. EEPROMs, ROMs, PROMs, RAMs, DRAMs, SRAMs, Flash Memory, firmware, programmable logic, etc.), Solid State Devices (SSD), computer encoded and readable punch cards, etc. The computer readable storage medium may further comprise a hardware device implementing firmware, microcode, etc., such as in an integrated circuit chip, a programmable logic device, a Programmable Gate Array (PGA), field-programmable gate array (FPGA), Application Specific Integrated Circuit (ASIC), etc. Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The program code embedded on a computer readable storage medium may be transmitted as transmission signals from a transmitting station or computer to a receiving station or computer.

A computer readable storage medium is not comprised solely of transmission signals, but includes physical and tangible components. Those skilled in the art will recognize that many modifications may be made to this configuration without departing from the scope of the present invention, and that the article of manufacture may comprise suitable information bearing medium known in the art.

Computer program code for carrying out operations for aspects of the certain embodiments may be written in any combination of one or more programming languages. Blocks of the flowchart and block diagrams may be implemented by computer program instructions.

It should be appreciated that reference throughout this specification to "one embodiment" or "an embodiment" means that a particular feature, structure or characteristic described in connection with the embodiment is included in at least one embodiment of the present invention. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the invention.

Similarly, it should be appreciated that in the foregoing description of embodiments of the invention, various features are sometimes grouped together in a single embodiment, figure, or description thereof for the purpose of streamlining the disclosure aiding in the understanding of one or more of the various inventive aspects. This method of disclosure, however, is not to be interpreted as reflecting an intention that the claimed subject matter requires more features than are expressly recited in each claim. Rather, as the following claims reflect, inventive aspects lie in less than all features of a single foregoing disclosed embodiment. Thus, the claims following the detailed description are hereby expressly incorporated into this detailed description.

With embodiments, machine-readable storage includes machine-readable instructions, when executed, to implement a method or realize an apparatus as described herein.

The described data structures and information in FIGS. 1-10 are provided by way of example, and in further embodiments, certain of the described information fields may not be included and information in addition to that described may be provided.

The terms "an embodiment", "embodiment", "embodiments", "the embodiment", "the embodiments", "one or more embodiments", "some embodiments", and "one embodiment" mean "one or more (but not all) embodiments of the present invention(s)" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments of the present invention.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments of the present invention need not include the device itself.

At least certain operations that may have been illustrated in the figures show certain events occurring in a certain order. In alternative embodiments, certain operations may be performed in a different order, modified or removed. Moreover, steps may be added to the above described logic and still conform to the described embodiments. Further, operations described herein may occur sequentially or certain operations may be processed in parallel. Yet further, operations may be performed by a single processing unit or by distributed processing units.

The foregoing description of various embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. The above specification, examples and data provide a complete description of the manufacture and use of the composition of the invention. Since many embodiments of the invention can be made without departing from the spirit and scope of the invention, the invention resides in the claims herein after appended.

EXAMPLES

The following examples pertain to further embodiments.

Example 1 is an apparatus that is able to resume programming after a power loss, comprising: a storage die comprising single level cell NAND blocks and multi-level cell NAND blocks; and a storage die controller to: in response to receipt of an indication of the power loss, copy data that was to be programmed to the multi-level cell NAND blocks to the single level cell NAND blocks, and store a pulse number at which programming was interrupted; and, in response to receipt of an indication to resume from the power loss, copy the data from the single level cell NAND blocks to a page buffer, retrieve the pulse number, and resume programming of the multi-level cell NAND blocks at the retrieved pulse number using the data.

In Example 2, the subject matter of examples 1 and 3-6 can optionally include the storage die controller determining the single level cell NAND blocks to copy the data to.

In Example 3, the subject matter of examples 1, 2, and 4-6 can optionally include the storage die controller storing the pulse number in flag locations of the single level cell NAND blocks.

In Example 4, the subject matter of examples 1-3 and 5-6 can optionally include the storage die controller resuming programming at a lower pulse number than the retrieved pulse number.

In Example 5, the subject matter of examples 1-4 and 6 can optionally include the storage die controller determining whether programming of the multi-level cell NAND blocks can be finished.

In Example 6, the subject matter of examples 1-5 can optionally include the storage die controller storing the data to be programmed in a page buffer and copying the data to be programmed from the page buffer to the single level cell NAND blocks.

Example 7 is a method for resuming programming after a power loss, comprising: in response to receipt of an indication of the power loss, copying data that was to be programmed to multi-level cell NAND blocks to single level cell NAND blocks and storing a pulse number at which programming was interrupted; and, in response to receipt of an indication to resume from the power loss, copying the data from the single level cell NAND blocks to a page buffer, retrieving the pulse number, and resuming programming of the multi-level cell NAND blocks at the retrieved pulse number using the data in the page buffer.

In Example 8, the subject matter of examples 7 and 9-12 can optionally include determining the single level cell NAND blocks to copy the data to.

In Example 9, the subject matter of examples 7-8 and 10-12 can optionally include storing the pulse number in flag locations of the single level cell NAND blocks.

In Example 10, the subject matter of examples 7-9 and 11-12 can optionally include resuming programming at a lower pulse number than the retrieved pulse number.

In Example 11, the subject matter of examples 7-10 and can optionally include determining whether programming of the multi-level cell NAND blocks can be finished.

In Example 12, the subject matter of examples 7-11 can optionally include storing the data to be programmed in a page buffer, and copying the data to be programmed from the page buffer to the single level cell NAND blocks.

Examiner 13 is an apparatus that is able to resume programming after a power loss, comprising: a storage die comprising single level cell NAND blocks and multi-level cell NAND blocks; and a storage die controller to: in response to receipt of an indication to resume from the power loss, copy data for programming the multi-level cell NAND blocks from the single level cell NAND blocks to a page buffer, compare threshold voltages of memory cells of a wordline whose programming was interrupted against verify levels, select a highest level that was programmed before the power loss, calculate a pulse number based on the highest level found in a lookup table, and resume programming of the multi-level cell NAND blocks at the calculated pulse number using the data.

In Example 14, the subject matter of examples 13 and 15-18 can optionally include the storage die controller counting a number of failing bits for each of the verify levels, and selecting the highest level based on having a number of failing bits lower than a prescribed threshold.

In Example 15, the subject matter of examples 13-14 and 16-18 can optionally include the storage die controller determining the single level cell NAND blocks to copy the data to.

In Example 16, the subject matter of examples 13-15 and 17-18 can optionally include the storage die controller resuming programming at a lower pulse number than the calculated pulse number.

In Example 17, the subject matter of examples 13-16 and 18 can optionally include that the lookup table includes columns for a level, an expected start pulse, and an expected end pulse.

In Example 18, the subject matter of examples 13-17 can optionally include that that the indication of the power loss and the indication to resume from the power loss are received from a storage device controller.

Examiner 19 is a method for resuming programming after a power loss, comprising: in response to receipt of an indication to resume from the power loss, copying data for programming multi-level cell NAND blocks from single level cell NAND blocks to a page buffer, comparing threshold voltages of memory cells of a wordline whose programming was interrupted against verify levels, selecting a highest level that was programmed before the power loss, calculating a pulse number based on the highest level found in a lookup table, and resuming programming of the multi-level cell NAND blocks at the calculated pulse number using the data.

In Example 20, the subject matter of examples 19 and 21-24 can optionally include counting a number of failing bits for each of the verify levels and selecting the highest level based on having a number of failing bits lower than a prescribed threshold.

In Example 21, the subject matter of examples 19 and 21-24 can optionally include determining the single level cell NAND blocks to copy the data to.

In Example 22, the subject matter of examples 19-21 and 23-24 can optionally include resuming programming at a lower pulse number than the calculated pulse number.

In Example 23, the subject matter of examples 19-22 and 24 can optionally include that the lookup table includes columns for a level, an expected start pulse, and an expected end pulse.

In Example 24, the subject matter of examples 19-23 can optionally include that the indication of the power loss and the indication to resume from the power loss are received from a storage device controller.

Examiner 25 is an apparatus for resuming programming after a power loss, comprising: in response to receipt of an indication of the power loss, means for copying data that was to be programmed to multi-level cell NAND blocks to single level cell NAND blocks, and means for storing a pulse number at which programming was interrupted; and, in response to receipt of an indication to resume from the power loss, means for copying the data from the single level cell NAND blocks to a page buffer, means for retrieving the pulse number, and means for resuming programming of the multi-level cell NAND blocks at the retrieved pulse number using the data in the page buffer.

Examiner 26 is an apparatus for resuming programming after a power loss, comprising: in response to receipt of an indication to resume from the power loss, means for copying data for programming multi-level cell NAND blocks from single level cell NAND blocks to a page buffer, means for comparing threshold voltages of memory cells of a wordline whose programming was interrupted against verify levels, means for selecting a highest level that was programmed before the power loss, means for calculating a pulse number based on the highest level found in a lookup table, and means for resuming programming of the multi-level cell NAND blocks at the calculated pulse number using the data.

What is claimed:
1. An apparatus that is able to resume programming after a power loss, comprising:

a storage die comprising single level cell NAND blocks and multi-level cell NAND blocks; and
a storage die controller to:
in response to receipt of an indication of the power loss,
copy data that was to be programmed to the multi-level cell NAND blocks to the single level cell NAND blocks; and
store a pulse number of a pulse at which programming was interrupted, wherein the programming applies a plurality of pulses that are each associated with a pulse number; and
in response to receipt of an indication to resume from the power loss,
copy the data from the single level cell NAND blocks to a page buffer;
retrieve the pulse number; and
resume programming of the multi-level cell NAND blocks at a lower pulse number than the retrieved pulse number using the data to account for charge loss.

2. The apparatus of claim 1, wherein the storage die controller is to:
determine the single level cell NAND blocks to copy the data to.

3. The apparatus of claim 2, wherein the storage die controller is to:
store the pulse number in flag locations of the single level cell NAND blocks.

4. The apparatus of claim 1, wherein the storage die controller is to:
determine whether programming of the multi-level cell NAND blocks can be finished.

5. The apparatus of claim 1, wherein the storage die controller is to:
store the data to be programmed in a page buffer; and
copy the data to be programmed from the page buffer to the single level cell NAND blocks.

6. A method for resuming programming after a power loss, comprising:
in response to receipt of an indication of the power loss,
copying data that was to be programmed to multi-level cell NAND blocks to single level cell NAND blocks; and
storing a pulse number of a pulse at which programming was interrupted, wherein
the programming applies a plurality of pulses that are each associated with a pulse number; and
in response to receipt of an indication to resume from the power loss,
copying the data from the single level cell NAND blocks to a page buffer;
retrieving the pulse number; and
resuming programming of the multi-level cell NAND blocks at a lower pulse number than the retrieved pulse number using the data in the page buffer to account for charge loss.

7. The method of claim 6, further comprising:
determining the single level cell NAND blocks to copy the data to.

8. The method of claim 7, further comprising:
storing the pulse number in flag locations of the single level cell NAND blocks.

9. The method of claim 6, further comprising:
determining whether programming of the multi-level cell NAND blocks can be finished.

10. The method of claim 6, further comprising:
storing the data to be programmed in a page buffer; and
copying the data to be programmed from the page buffer to the single level cell NAND blocks.

11. An apparatus that is able to resume programming after a power loss, comprising:
a storage die comprising single level cell NAND blocks and multi-level cell NAND blocks; and
a storage die controller to:
in response to receipt of an indication to resume from the power loss,
copy data for programming the multi-level cell NAND blocks from the single level cell NAND blocks to a page buffer;
compare threshold voltages of memory cells of a wordline whose programming was interrupted against verify levels;
select a highest level that was programmed before the power loss;
calculate a pulse number based on the highest level found in a lookup table; and
resume programming of the multi-level cell NAND blocks at the calculated pulse number using the data.

12. The apparatus of claim 11, wherein the storage die controller is to:
count a number of failing bits for each of the verify levels; and
select the highest level based on having a number of failing bits lower than a prescribed threshold.

13. The apparatus of claim 11, wherein the storage die controller is to:
determine the single level cell NAND blocks to copy the data to.

14. The apparatus of claim 11, wherein the storage die controller is to:
resume programming at a lower pulse number than the calculated pulse number.

15. The apparatus of claim 11, wherein the lookup table includes columns for a level, an expected start pulse, and an expected end pulse.

16. The apparatus of claim 11, wherein the indication of the power loss and the indication to resume from the power loss are received from a storage device controller.

17. A method for resuming programming after a power loss, comprising:
in response to receipt of an indication to resume from the power loss,
copying data for programming multi-level cell NAND blocks from single level cell NAND blocks to a page buffer;
comparing threshold voltages of memory cells of a wordline whose programming was interrupted against verify levels;
selecting a highest level that was programmed before the power loss;
calculating a pulse number based on the highest level found in a lookup table; and
resuming programming of the multi-level cell NAND blocks at the calculated pulse number using the data.

18. The method of claim 17, further comprising:
counting a number of failing bits for each of the verify levels; and
selecting the highest level based on having a number of failing bits lower than a prescribed threshold.

19. The method of claim 17, further comprising:
determining the single level cell NAND blocks to copy the data to.

20. The method of claim 17, further comprising:
resuming programming at a lower pulse number than the calculated pulse number.

21. The method of claim 17, wherein the lookup table includes columns for a level, an expected start pulse, and an expected end pulse.

22. The method of claim 17, wherein the indication of the power loss and the indication to resume from the power loss are received from a storage device controller.

* * * * *